US012597899B2

(12) United States Patent
Jingu

(10) Patent No.: US 12,597,899 B2
(45) Date of Patent: Apr. 7, 2026

(54) SWITCHING AMPLIFIER

(71) Applicant: SONY SEMICONDUCTOR SOLUTIONS CORPORATION, Kanagawa (JP)

(72) Inventor: Yoshikatsu Jingu, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 803 days.

(21) Appl. No.: 17/758,874

(22) PCT Filed: Nov. 27, 2020

(86) PCT No.: PCT/JP2020/044209
§ 371 (c)(1),
(2) Date: Dec. 23, 2022

(87) PCT Pub. No.: WO2021/149354
PCT Pub. Date: Jul. 29, 2021

(65) Prior Publication Data
US 2023/0179158 A1       Jun. 8, 2023

(30) Foreign Application Priority Data

Jan. 22, 2020     (JP) ................................. 2020-007986

(51) Int. Cl.
*H03F 3/70*           (2006.01)
*H03F 3/217*          (2006.01)
(52) U.S. Cl.
CPC ............. *H03F 3/70* (2013.01); *H03F 3/2171* (2013.01)

(58) Field of Classification Search
CPC ...... H03F 3/70; H03F 3/2171; H02M 7/4815; H02M 1/007; H02M 7/537
(Continued)

(56) References Cited

U.S. PATENT DOCUMENTS 4,635,175 A      1/1987  Probst
10,008,926 B2 *  6/2018  Huang ..................... H02M 3/07
(Continued)

FOREIGN PATENT DOCUMENTS

CN        102611398 A     7/2012
CN        103066832 A     4/2013
(Continued)

OTHER PUBLICATIONS

International Search Report and Written Opinion of PCT Application No. PCT/JP2020/044209, issued on Dec. 28, 2020, 11 pages of ISRWO.

*Primary Examiner* — Hieu P Nguyen
(74) *Attorney, Agent, or Firm* — CHIP LAW GROUP

(57)       ABSTRACT

The present invention increases the output voltage of a switching amplifier in a situation where the power supply voltage is limited. The switching amplifier includes first and second switches that are turned on and off in a complementary manner, and a capacitance, both ends of which serve as inputs to a power combiner. Both ends of the capacitance are connected to output ends of the first and second switches. The capacitance is supplied with power along with the operation of the first and second switches. As a result, an electric charge in the capacitance is used as a charge pump, and is used alternatingly for boosting or stepping down the output voltage depending on the operation frequency of the switching amplifier, thereby generating a rectangular voltage with a controlled wave height.

12 Claims, 12 Drawing Sheets

(58) Field of Classification Search
    USPC ............................................ 330/251, 9, 297
    See application file for complete search history.

(56) References Cited

U.S. PATENT DOCUMENTS

| | | | | |
|---|---|---|---|---|
| 10,305,377 B2 * | 5/2019 | Cherniak | ................ | H02M 3/07 |
| 10,797,593 B1 * | 10/2020 | Ke | ......................... | H02M 3/07 |

FOREIGN PATENT DOCUMENTS

| | | | |
|---|---|---|---|
| CN | 104702095 | A | 6/2015 |
| JP | 6-351229 | A | 12/1994 |
| JP | 2004-336904 | A | 11/2004 |
| JP | 2006319684 | A | 11/2006 |
| JP | 2010-172050 | A | 8/2010 |
| JP | 2012-170304 | A | 9/2012 |
| JP | 2012186435 | A | 9/2012 |
| JP | 2014-045335 | A | 3/2014 |
| JP | 2015-164386 | A | 9/2015 |
| JP | 2016149751 | A | 8/2016 |

* cited by examiner

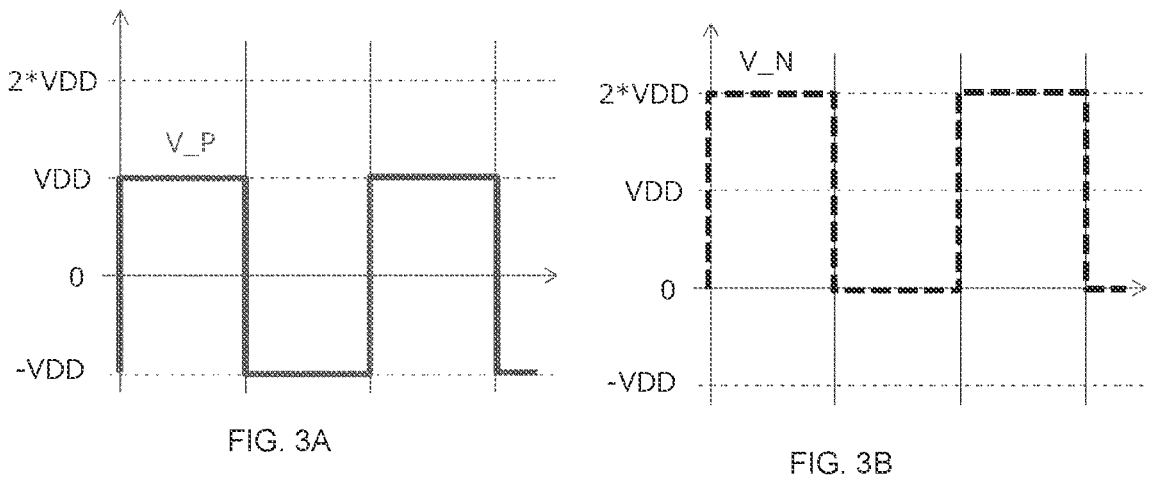
FIG. 3A
FIG. 3B
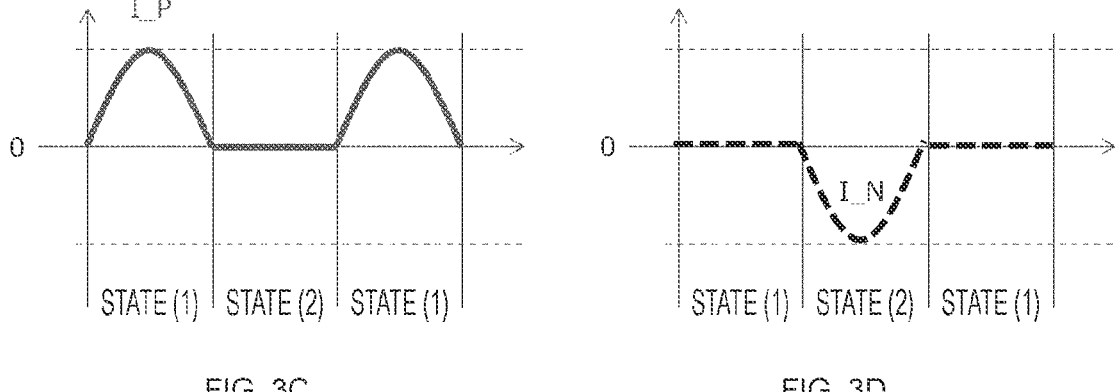
FIG. 3C
FIG. 3D

SWITCHING AMPLIFIER

CROSS REFERENCE TO RELATED APPLICATIONS

This application is a U.S. National Phase of International Patent Application No. PCT/JP2020/044209 filed on Nov. 27, 2020, which claims priority benefit of Japanese Patent Application No. JP 2020-007986 filed in the Japan Patent Office on Jan. 22, 2020. Each of the above-referenced applications is hereby incorporated herein by reference in its entirety.

TECHNICAL FIELD

The present technology relates to a switching amplifier. Specifically, the present technology relates to a switching amplifier that boosts or steps down a voltage.

BACKGROUND ART

Two types of switching amplifiers are generally known, a class D amplifier and a class E amplifier. Switching amplifiers are highly efficient in principle, and thus, they have been increasingly used for communication amplifiers for mobile devices in recent years. Meanwhile, communication situations have deteriorated due to an increase in mobile devices. Therefore, it is required to increase output power of power amplifiers. However, there is an upper limit in a battery voltage of a lithium ion battery or the like used in a mobile device. In a case where a power supply voltage supplied to the amplifier is fixed, it is necessary to lower impedances of the amplifier and a load and to increase an output current of the amplifier in order to increase the output power of the amplifier. Reducing a circuit impedance and increasing an output current to increase the output power is often disadvantageous in terms of efficiency. For example, the loss due to parasitic resistance of a wire increases in proportion to the increase in the output current. In addition, when the load impedance is lowered, the number of components of a matching element is increased, and an insertion loss of a signal is generally increased. That is, the class D amplifier that directly outputs a power supply voltage has a side effect of an increase in loss due to an increase in the output current when increasing the output power. In comparison, in the class E amplifier, even if a power supply voltage is limited, the resonance impedance of a matching circuit is designed to be high, so that the output voltage can be raised, and the output power can be increased without increasing the output current.

In this respect, it can be said that the class E amplifier is an excellent amplifier having a low loss for implementing a high-output power amplifier. However, the degree of boosting the output voltage of the class E amplifier greatly depends on the resonance impedance of the matching circuit. Here, a case where an antenna of a transmitter using a class E amplifier approaches metal is considered. Due to close contact between the antenna and the metal, the impedance of the antenna may significantly deviate from 50 ohms which is a standard value. When the impedance of the antenna changes, the resonance impedance of a matching circuit of the class E amplifier changes. The output voltage of the class E amplifier is boosted unexpectedly due to the change in the resonance impedance, and the amplifier may fail. That is, in order to achieve a low-loss high-output amplifier, the boosting action of the output voltage is effective in order not to increase the output current, but the boosting amount needs to be controlled to a constant amount regardless of an external environment. In view of this, a charge pump circuit has been proposed as a representative technique for achieving controlled boosting (see, for example, Patent Document 1).

CITATION LIST

Patent Document

Patent Document 1: Japanese Patent Application Laid-Open No. 2015-164386

SUMMARY OF THE INVENTION

Problems to be Solved by the Invention

According to the charge pump circuit described above, the boosting amount can be controlled to be constant by storing a constant amount of electric charges into a capacitance using the rectification effect of a diode or a switching element. However, a power loss occurs in the diode or the switching element when the capacitance is charged. Furthermore, power consumption involved with control of the switching element occurs. That is, when a voltage is raised by a common charge pump, a boosting amount is controlled to be constant, but an increase in area, a power loss, and power consumption for control by circuit elements other than an amplifier occur. In addition, a class D amplifier using a negative power supply and a positive power supply is also common, and this is equivalent to controlling the boosting amount to be constant. However, such a class D amplifier needs a power supply circuit for generating a negative voltage, so that the area and the power consumption both increase. As described above, there is a problem that, when the output power of the amplifier increases in a situation where the power supply voltage is limited, the power consumption increases or the reliability of the amplifier is sacrificed.

The present technology has been accomplished in view of such a circumstance, and an object thereof is to increase an output voltage of a switching amplifier in a situation where a power supply voltage is limited.

Solutions to Problems

The present technology is accomplished to address the above-mentioned problem, and a first aspect thereof provides a switching amplifier including: a first switch and a second switch that are turned on and off in a complementary manner; and a capacitance having both ends connected to output ends of the first and second switches, the capacitance receiving power from a power supply.

In addition, the switching amplifier according to the first aspect may further include: a first impedance element that is connected between one end of the capacitance and a power supply terminal; and a second impedance element that is connected to another end of the capacitance and a ground terminal. This configuration provides an effect of supplying power to the capacitance via the first and second impedance elements to charge the capacitance.

In addition, in the switching amplifier according to the first aspect, the first switch may have an input end that is connected to the power supply terminal and an output end that is connected to the another end of the capacitance, and the second switch may have an input end that is connected to the ground terminal and an output end that is connected to the one end of the capacitance.

In addition, the switching amplifier according to the first aspect may further include a power combiner that combines power of signals supplied from both ends of the capacitance, and supplies the combined power to a load from an output terminal.

In addition, in the switching amplifier according to the first aspect, the power combiner may include a first capacitor and a second capacitor which have input ends respectively connected to both ends of the capacitance and which have output ends connected to each other to form a terminal serving as the output terminal. Thus, an effect of implementing the power combiner with the first and second capacitors is provided.

In addition, in the switching amplifier according to the first aspect, the power combiner may include the first and second capacitors instead of the capacitance. This configuration provides an effect of imparting the function of the capacitance to the first and second capacitors of the power combiner.

In addition, in the switching amplifier according to the first aspect, the power combiner may include a transformer instead of the first and second impedance elements. This configuration provides an effect of implementing the power combiner with a transformer.

In addition, in the switching amplifier according to the first aspect, the power combiner may include a first common gate transistor and a second common gate transistor which have sources connected to both ends of the capacitance and which have drains connected to each other to form a terminal serving as the output terminal. This configuration provides an effect of setting the voltage of the combined power to be the same as the source voltage by allowing the common gate transistors to function as a switch.

In addition, in the switching amplifier according to the first aspect, the first switch and the second switch may include a first transistor and a second transistor that are turned on and off in a complementary manner. This configuration provides an effect of implementing the first and second switches with the first and second transistors.

In addition, in the switching amplifier according to the first aspect, the first switch and the second switch may further have a first common gate transistor connected to the first transistor in cascode and a second common gate transistor connected to the second transistor in cascode. This configuration provides an effect of dividing a voltage applied to each transistor.

In addition, in the switching amplifier according to the first aspect, the first switch and the second switch may include a first common gate transistor and a second common gate transistor that are turned on and off in a complementary manner. This configuration provides an effect of dividing a voltage applied to each transistor.

In addition, in the switching amplifier according to the first aspect, the first switch and the second switch may further be connected to both ends of the capacitance, and multiple stages of the first and second switches and the capacitance may be connected. This configuration provides an effect of increasing a voltage to be finally output.

BRIEF DESCRIPTION OF DRAWINGS

FIGS. 3A, 3B, 3C, and 3D are diagrams illustrating an example of an output waveform of the switching amplifier according to the embodiment of the present technology.

MODE FOR CARRYING OUT THE INVENTION

A mode (hereinafter referred to as an embodiment) for carrying out the present technology will be described below. The description will be given in the following order.

1. Basic configuration
2. Example

1. BASIC CONFIGURATION

[Configuration of Switching Amplifier]

Figure 1:
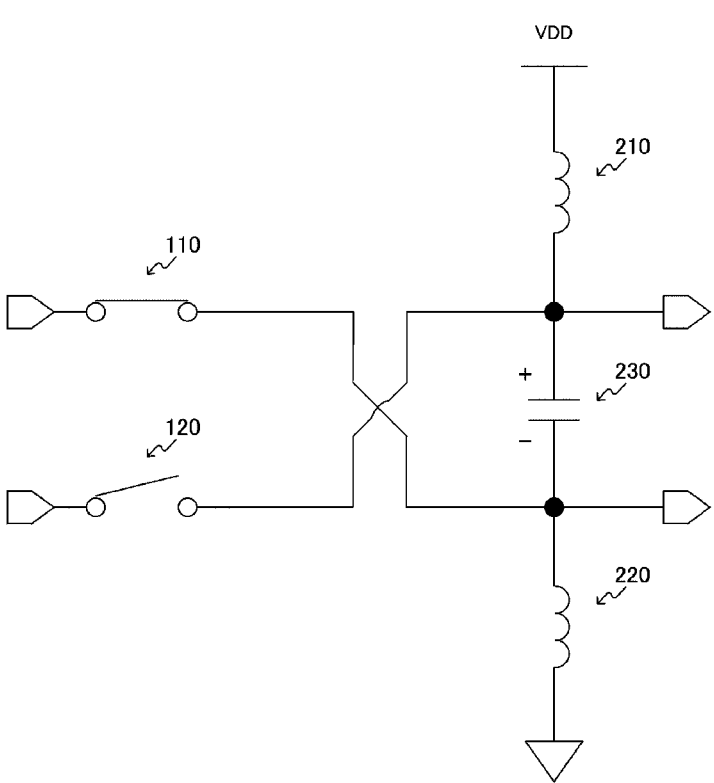
FIG. 1 is a diagram illustrating an example of a basic configuration of a switching amplifier according to an embodiment of the present technology.

FIG. 1 is a diagram illustrating an example of a basic configuration of a switching amplifier according to the embodiment of the present technology. The switching amplifier includes switches 110 and 120, inductors 210 and 220, and a capacitance 230.

The switches 110 and 120 are turned on and off in a complementary manner. An output end of the switch 110 is connected to a negative end of the capacitance 230. Further, a power supply terminal is connected to an input end of the switch 110 as described later. An output end of the switch 120 is connected to a positive end of the capacitance 230. Further, a ground terminal is connected to an input end of the switch 120 as described later.

The inductors 210 and 220 are examples of impedance elements through which a direct current for charging the capacitance 230 passes. The inductor 210 is connected between the positive end of the capacitance 230 and the power supply terminal. The inductor 220 is connected between the negative end of the capacitance 230 and the ground terminal. In this example, the inductors 210 and 220 are illustrated as an example of the impedance element, but other elements may be used. In that case, the impedance element needs to have high impedance for a high frequency signal and low impedance for a low frequency signal (direct current). In addition, the impedance element needs to be unaffected by the voltage range of the power supply potential and the ground potential, that is, not to have voltage dependence.

The capacitance 230 is an element that stores an electric charge therein via the inductors 210 and 220 and functions as a charge pump. That is, in this switching amplifier, the stored electric charge in the capacitance 230 is used in order to control a boosting amount and a step-down amount of the output voltage.

Figure 2:
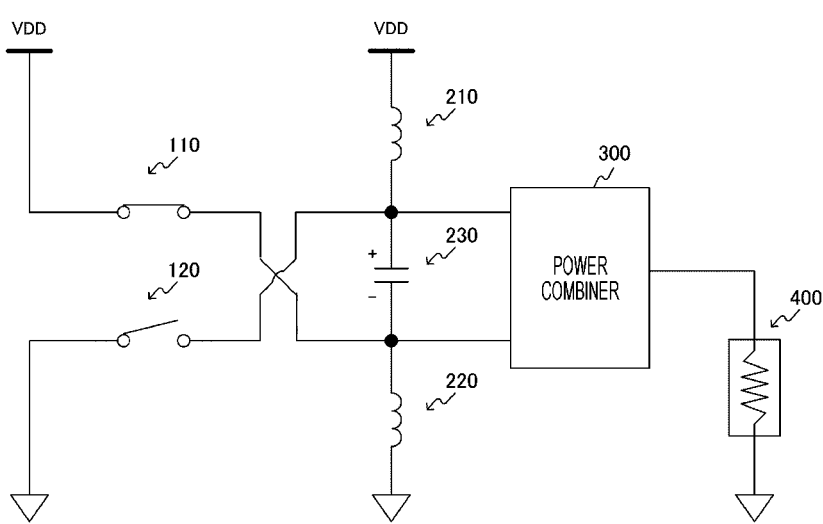
FIG. 2 is a diagram illustrating an example of an entire configuration of the switching amplifier according to the embodiment of the present technology.

FIG. 2 is a diagram illustrating an example of an entire configuration of the switching amplifier according to the embodiment of the present technology.

The switching amplifier includes a power combiner 300 at a subsequent stage of the above-described basic configuration. Further, the power supply terminal is connected to the input end of the switch 110, and the ground terminal is connected to the input end of the switch 120.

The power combiner 300 combines power of signals supplied from both ends of the capacitance 230, and supplies the combined power to a load 400 from an output terminal.

An amount of electric charges stored in the capacitance 230 in a steady state is determined by a voltage applied to the capacitance 230 and a capacitance value. Therefore, the boosting amount and the step-down amount of the output voltage to the power combiner 300 are controlled to constant values. The electric charge stored in the capacitance 230 is used as a charge pump, and is used for alternately raising or stepping down the output voltage at the operating frequency of the switching amplifier.

FIGS. 3A, 3B, 3C, and 3D are diagrams illustrating an example of an output waveform of the switching amplifier according to the embodiment of the present technology.

In FIGS. 3A, 3B, 3C, and 3D, a voltage at the positive end of the capacitance 230 is referred to as V_N, and a current flowing through the positive end of the capacitance 230 is referred to as I_N. In addition, a voltage at the negative end of the capacitance 230 is referred to as V_P, and a current flowing through the negative end of the capacitance 230 is referred to as I_P. FIG. 3A represents the voltage V_P at the negative end of the capacitance 230. FIG. 3B represents the voltage V_N at the positive end of the capacitance 230. FIG. 3C represents the current I_P flowing through the switch 110. FIG. 3D represents the current I_N flowing through the switch 120.

In a state (1), the switch 110 is turned on, and the switch 120 is turned off. In this case, the voltage V_P at the negative end of the capacitance 230 is equal to a power supply voltage VDD. In addition, a potential difference of VDD is generated at both ends of the capacitance 230 at this time due to the stored electric charge, so that the voltage V_N at the positive end of the capacitance 230 has a potential twice as large as VDD.

In a state (2), the switch 110 is turned off, and the switch 120 is turned on. In this case, the voltage V_N at the positive end of the capacitance 230 is equal to the ground potential. In addition, a potential difference of VDD is generated at both ends of the capacitance 230 at this time due to the stored electric charge, so that the voltage V_P at the negative end of the capacitance 230 has a potential of –VDD.

Thus, due to the configuration in which the switches 110 and 120 are connected to both ends of the capacitance 230 and are turned on and off in a complementary manner to repeat the state (1) and the state (2), a rectangular voltage with a controlled wave height as in a class D amplifier is generated. That is, the voltage is raised at the positive end of the capacitance 230 and stepped down at the negative end of the capacitance 230, and the respective nodes have rectangular voltages having the same phase with an amplitude of 2 VDD.

As a result, the currents I_P and I_N flowing through the switches 110 and 120 have a push-pull relationship. The power combiner 300 combines power generated in this manner. Therefore, the current flowing through the load 400 has a sine wave obtained by combining FIGS. 3C and 3D.

[Modifications]

Figure 4:
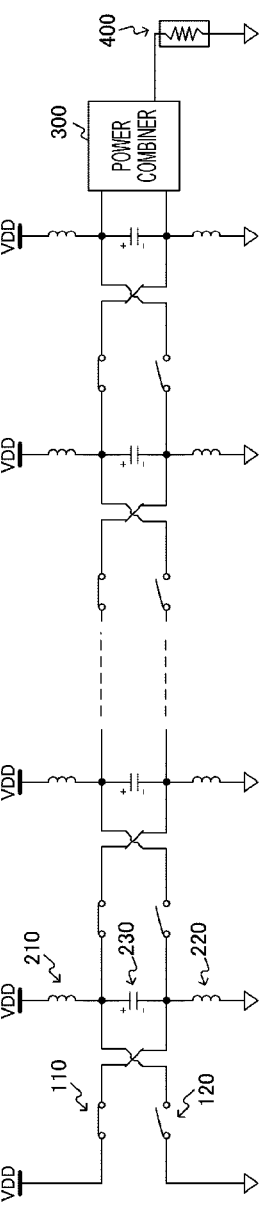
FIG. 4 is a diagram illustrating a modification of the switching amplifier according to the embodiment of the present technology.

FIG. 4 is a diagram illustrating a modification of the switching amplifier according to the embodiment of the present technology.

A plurality of the above-described basic configurations of the switching amplifier may be connected in cascade as in this modification. That is, the switches 110 and 120 may be further connected to both ends of the capacitance 230, and multiple stages of the switches 110 and 120 and the capacitance 230 may be connected. This makes it possible to increase a voltage to be finally output.

2. Embodiment

First Example

Figure 5:
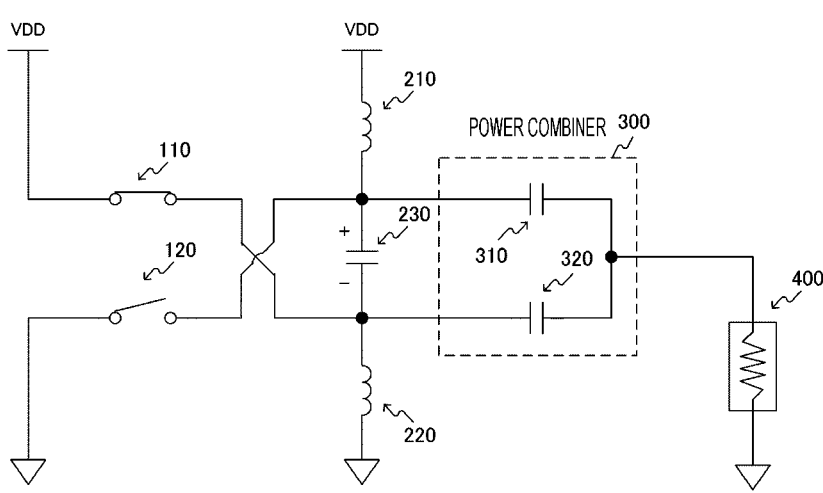
FIG. 5 is a diagram illustrating a first example of the switching amplifier according to the embodiment of the present technology.

FIG. 5 is a diagram illustrating a first example of the switching amplifier according to the embodiment of the present technology.

In this first example, the power combiner 300 includes capacitances 310 and 320. That is, in the first example, the power combiner 300 is achieved by capacitive coupling. In this case, a direct current does not flow, and only an alternating-current component is transmitted to the load 400.

Second Example

Figure 6:
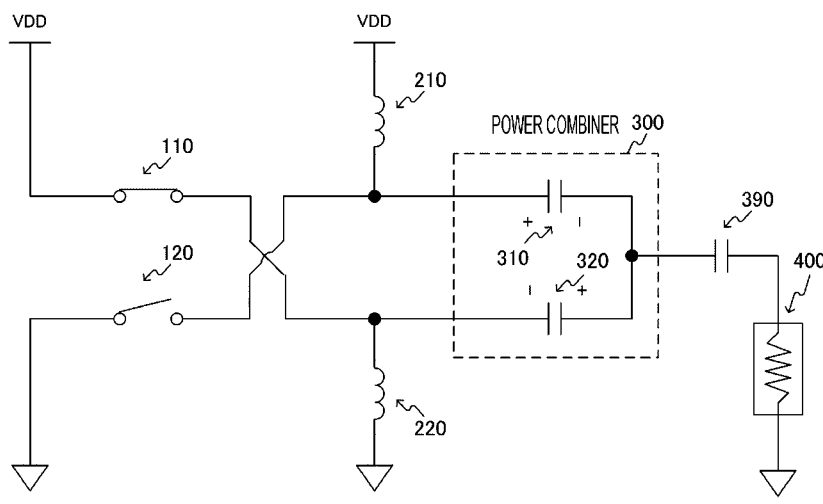
FIG. 6 is a diagram illustrating a second example of the switching amplifier according to the embodiment of the present technology.

FIG. 6 is a diagram illustrating a second example of the switching amplifier according to the embodiment of the present technology.

The second example has a configuration obtained by removing the capacitance 230 from the configuration of the first example. In this case, the capacitances 310 and 320 of the power combiner 300 have a function similar to the function of the capacitance 230. That is, the capacitances 310 and 320 connected in series function as the capacitance 230 and achieve capacitive coupling to the load 400. Therefore, a capacitance 390 between the power combiner 300 and the load 400 may be eliminated.

Third Example

Figure 7:
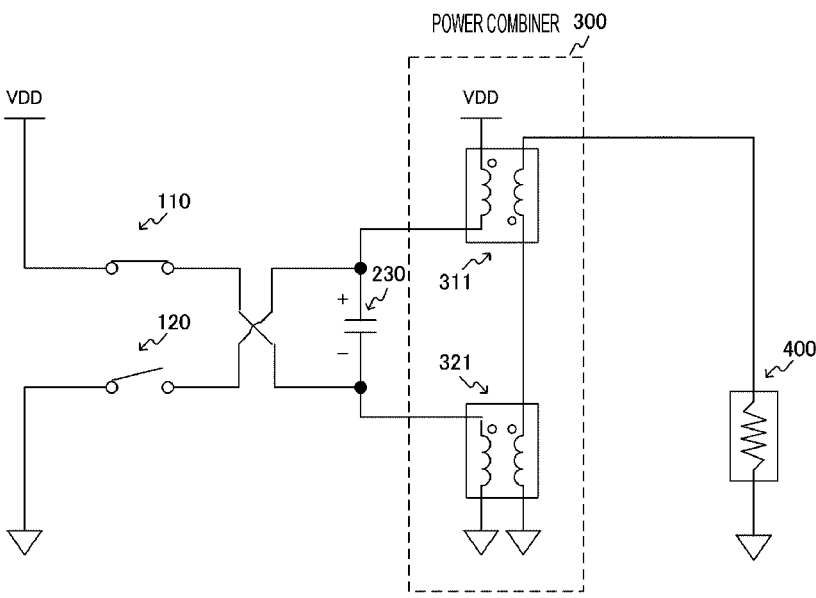
FIG. 7 is a diagram illustrating a third example of the switching amplifier according to the embodiment of the present technology.

FIG. 7 is a diagram illustrating a third example of the switching amplifier according to the embodiment of the present technology.

In this third example, the power combiner 300 includes transformers 311 and 321. That is, in the third example, the power combiner 300 includes the inductors 210 and 220 therein and is magnetically coupled (transformer coupled) with the load 400.

Accordingly, in the third example, not only the alternating-current component but also the direct current component can be transformed.

Fourth Example

Figure 8:
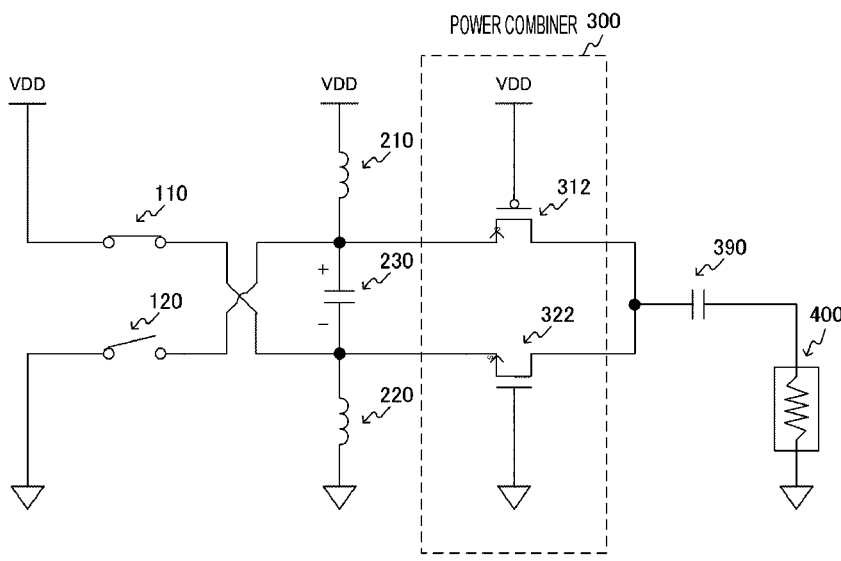
FIG. 8 is a diagram illustrating a fourth example of the switching amplifier according to the embodiment of the present technology.

FIG. 8 is a diagram illustrating a fourth example of the switching amplifier according to the embodiment of the present technology.

In the fourth example, the power combiner 300 includes MOS transistors 312 and 322. The source of the transistor 312 is connected to the positive end of the capacitance 230, and the base is connected to the power supply terminal. In addition, the source of the transistor 322 is connected to the negative end of the capacitance 230, and the base is connected to the ground terminal. The drains of the transistors 312 and 322 are connected to each other and connected to the load 400 via the capacitance 390.

As a result, in the fourth example, the MOS transistors 312 and 322 function as switches, and the maximum value and the minimum value of the voltage of combined power can be set to be the same as those of the input.

Fifth Example

Figure 9:
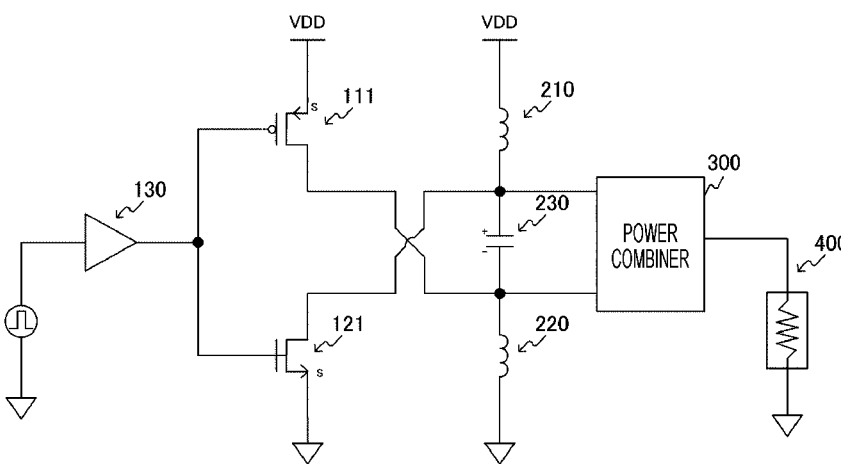
FIG. 9 is a diagram illustrating a fifth example of the switching amplifier according to the embodiment of the present technology.

FIG. 9 is a diagram illustrating a fifth example of the switching amplifier according to the embodiment of the present technology.

In the fifth example, switches 110 and 120 include common source transistors 111 and 121. An alternating-current signal is input to gates of the transistors 111 and 121 via a buffer 130, and the transistors 111 and 121 function as switches that are turned on and off in a complementary manner according to the alternating-current signal.

Sixth Example

Figure 10:
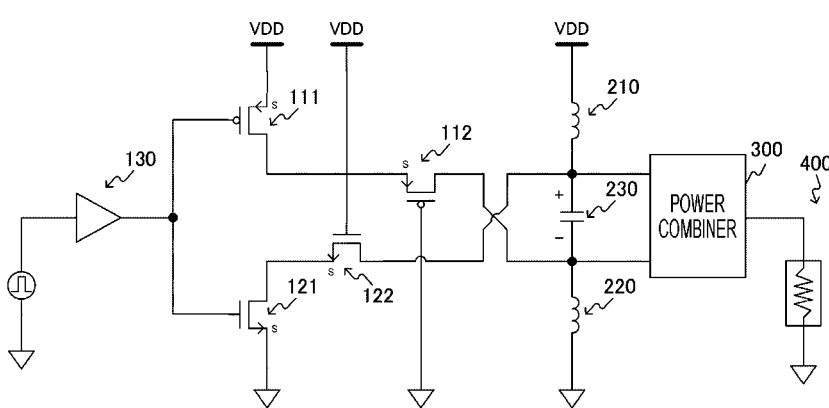
FIG. 10 is a diagram illustrating a sixth example of the switching amplifier according to the embodiment of the present technology.

FIG. 10 is a diagram illustrating a sixth example of the switching amplifier according to the embodiment of the present technology.

In the sixth example, the switches 110 and 120 include transistors 111, 112, 121, and 122. Here, the transistors 111 and 112 are connected in cascode. That is, the common source transistor 111 and the common gate transistor 112 are connected. Similarly, the transistors 121 and 122 are also connected in cascode. As a result, the voltage applied to the respective transistors can be divided, whereby each transistor can be protected.

Seventh Example

Figure 11:
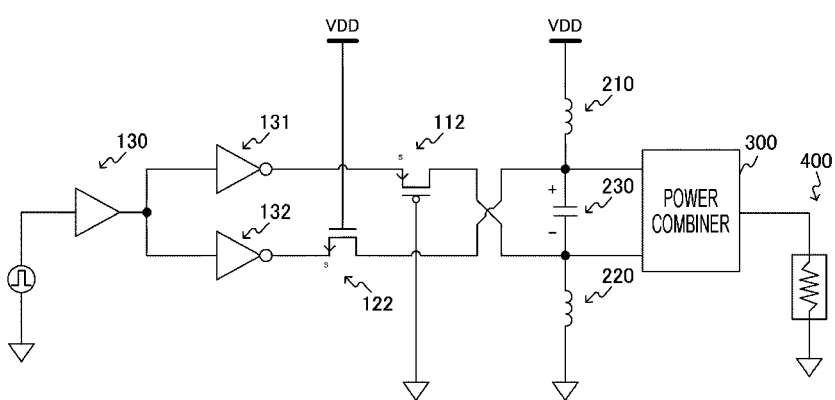
FIG. 11 is a diagram illustrating a seventh example of the switching amplifier according to the embodiment of the present technology.

FIG. 11 is a diagram illustrating a seventh example of the switching amplifier according to the embodiment of the present technology.

In the seventh example, the switches 110 and 120 include inverters 131 and 132 instead of the transistors 111 and 121 in the sixth example described above. This makes it possible to more accurately divide the voltage applied to each transistor as compared with the sixth example described above.

Eighth Example

Figure 12:
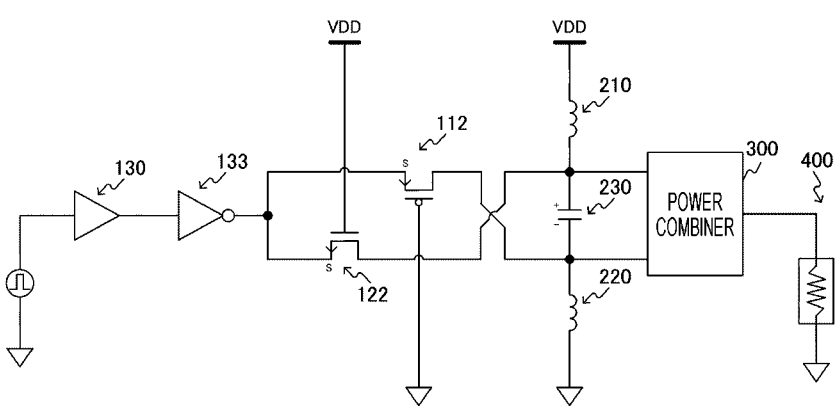
FIG. 12 is a diagram illustrating an eighth example of the switching amplifier according to the embodiment of the present technology.

FIG. 12 is a diagram illustrating an eighth example of the switching amplifier according to the embodiment of the present technology.

The eighth example is provided with an inverter 133 obtained by integrating the inverters 131 and 132 in the above-described seventh example. However, both are logically equivalent.

As described above, according to the embodiment of the present technology, electric charge is stored in the capacitance 230 via the inductors 210 and 220, and the switches 110 and 120 are turned on and off in a complementary manner, so that the capacitance 230 can function as a charge pump. Thus, a rectangular voltage with a controlled wave height can be generated, and the output voltage of the switching amplifier can be increased in a situation where the power supply voltage is limited.

The output current and the output voltage waveform of the switching amplifier according to the embodiment of the present technology are the same as those of the class D amplifier. However, the output voltage is more boosted as compared with a normal class D amplifier, whereby the output power increases. When the voltage charged in the capacitance 230 is VDD as in the above-described example, the amplitude of the output voltage is doubled, and thus the output power is quadrupled. Although the output power is quadrupled, the size of the switch of the amplifier does not change, so that the input power for driving the amplifier does not change. That is, the power added efficiency (power efficiency obtained by dividing the ratio of the output power to the input power by power consumption), which is a performance index of the power amplifier, dramatically increases. In addition, the size of the switch of the amplifier does not change, which contributes to reduction in a chip area.

Note that the above-described embodiment illustrates an example for embodying the present technology, and the matters in the embodiment and the invention-specifying matters in the claims have a correspondence relationship. Similarly, the invention-specifying matters in the claims and the matters in the embodiment of the present technology denoted by the same names as the invention-specifying matters have a correspondence relationship. However, the present technology is not limited to the embodiment, and can be embodied by making various modifications to the embodiment without departing from the gist thereof.

In addition, the effects described in the present specification are merely illustrative and not restrictive, and further, may have additional effects.

It is to be noted that the present technology may also have the following configurations.

(1) A switching amplifier including:

a first switch and a second switch that are turned on and off in a complementary manner; and a capacitance having both ends connected to output ends of the first and second switches, the capacitance receiving power from a power supply.

(2) The switching amplifier according to (1) described above, further including:

a first impedance element that is connected between one end of the capacitance and a power supply terminal; and a second impedance element that is connected to another end of the capacitance and a ground terminal.

(3) The switching amplifier according to (2) described above, in which the first switch has an input end that is connected to the power supply terminal and an output end that is connected to the another end of the capacitance, and the second switch has an input end that is connected to the ground terminal and an output end that is connected to the one end of the capacitance.

(4) The switching amplifier according to (3) described above, further including a power combiner that combines power of signals supplied from both ends of the capacitance, and supplies the combined power to a load from an output terminal.

(5) The switching amplifier according to (4) described above, in which the power combiner includes a first capacitor and a second capacitor which have input ends respectively connected to both ends of the capacitance and which have output ends connected to each other to form a terminal serving as the output terminal.

(6) The switching amplifier according to (5) described above, in which the power combiner includes the first capacitor and the second capacitor instead of the capacitance.

(7) The switching amplifier according to (4) described above, in which the power combiner includes a transformer instead of the first and second impedance elements.

(8) The switching amplifier according to (4) described above, in which the power combiner includes a first common gate transistor and a second common gate transistor which have sources connected to both ends of the capacitance and which have drains connected to each other to form a terminal serving as the output terminal.

(9) The switching amplifier according to any one of (1) to (8) described above, in which the first switch and the second switch include a first transistor and a second transistor that are turned on and off in a complementary manner.

(10) The switching amplifier according to (9) described above, in which the first switch and the second switch further have a first common gate transistor connected to the first transistor in cascode and a second common gate transistor connected to the second transistor in cascode.

(11) The switching amplifier according to any one of (1) to (10) described above, in which the first switch and the second switch include a first common gate transistor and a second common gate transistor that are turned on and off in a complementary manner.

(12) The switching amplifier according to any one of (1) to (11) described above, in which the first switch and the second switch are further connected to both ends of the capacitance, and multiple stages of the first and second switches and the capacitance are connected.

REFERENCE SIGNS LIST 110, 120 Switch
111, 112, 121, 122 Transistor
130 Buffer
131 to 133 Inverter
210, 220 Inductor
230 Capacitance
300 Power combiner
310, 320 Capacitance
311, 321 Transformer
312, 322 Transistor
390 Capacitance
400 Load

The invention claimed is:

1. A switching amplifier, comprising:
a first switch that includes:
an input end connected to a power supply terminal; and
an output end;
a second switch that includes:
an input end connected to a ground terminal; and
an output end,
wherein the first switch and the second switch are configured to turn on and turn off in a complementary manner; and
a capacitance that includes:

10 a first end connected to the output end of the first switch; and
a second end connected to the output end of the second switch, wherein the capacitance is configured to receive power from a power supply.

2. The switching amplifier according to claim 1, further comprising:
a first impedance element connected between the second end of the capacitance and the power supply terminal; and
a second impedance element connected to the first end of the capacitance and the ground terminal.

3. The switching amplifier according to claim 2, further comprising a power combiner configured to:
receive signals from both the first end and the second end of the capacitance;
combine power of the signals; and
supply the combined power to a load from an output terminal.

4. The switching amplifier according to claim 3, wherein the power combiner includes:
a first capacitor that includes:
an input end connected to the first end of the capacitance; and
an output end; and
a second capacitor that includes:
an input end connected to the second end of the capacitance; and
an output end,
wherein the output end of the first capacitor is connected to the output end of the second capacitor to form a terminal that serves as the output terminal.

5. The switching amplifier according to claim 4, wherein the power combiner includes, as the capacitance, the first capacitor and the second capacitor.

6. The switching amplifier according to claim 3, wherein the power combiner includes a transformer instead of the first impedance element and the second impedance element.

7. The switching amplifier according to claim 3, wherein the power combiner includes:
a first common gate transistor that includes:
a source connected to the second end of the capacitance; and
a drain; and
a second common gate transistor that includes:
a source connected to the first end of the capacitance; and
a drain,
wherein the drain of the first common gate transistor is connected to the drain of the second common gate transistor to form a terminal that serves as the output terminal.

8. The switching amplifier according to claim 1, wherein the first switch includes a first transistor,
the second switch includes a second transistor, and
the first transistor and the second transistor are configured to turn on and turn off in the complementary manner.

9. The switching amplifier according to claim 8, wherein the first switch further includes a first common gate transistor connected to the first transistor in cascode, and
the second switch further includes a second common gate transistor connected to the second transistor in cascode.

10. The switching amplifier according to claim 1, wherein the first switch includes a first common gate transistor,
the second switch includes a second common gate transistor, and the first common gate transistor and the second common gate transistor are configured to turn on and turn off in the complementary manner.

11. The switching amplifier according to claim 1, wherein multiple stages of the first switch and second switch, and the capacitance are connected.

12. A switching amplifier, comprising:

a first switch that includes:

an input end connected to a power supply terminal; and an output end;

a second switch that includes:

an input end connected to a ground terminal; and an output end, wherein the first switch and the second switch are configured to turn on and turn off in a complementary manner;

a capacitance that includes:

a first end connected to the output end of the first switch; and a second end connected to the output end of the second switch, wherein the capacitance is configured to receive power from a power supply;

a first impedance element connected between the second end of the capacitance and the power supply terminal; and a second impedance element connected to the first end of the capacitance and the ground terminal.

* * * * *